(12) United States Patent
Chow et al.

(10) Patent No.: US 7,952,211 B2
(45) Date of Patent: May 31, 2011

(54) SEMICONDUCTOR ASSEMBLY WITH COMPONENT PADS ATTACHED ON DIE BACK SIDE

(75) Inventors: Seng Guan Chow, Singapore (SG); Francis Heap Hoe Kuan, Singapore (SG)

(73) Assignee: Stats Chippac, Inc., Fremont, CA (US)

(*) Notice: Subject to any disclaimer, the term of this patent is extended or adjusted under 35 U.S.C. 154(b) by 0 days.

(21) Appl. No.: 12/577,343

(22) Filed: Oct. 12, 2009

(65) Prior Publication Data

US 2010/0032828 A1 Feb. 11, 2010

Related U.S. Application Data

(62) Division of application No. 11/521,974, filed on Sep. 14, 2006, now Pat. No. 7,622,811.

(51) Int. Cl.
*H01L 23/52* (2006.01)
*H01L 21/00* (2006.01)

(52) U.S. Cl. ........... 257/784; 257/E23.085; 257/786; 257/528; 257/532; 257/690; 257/728; 257/725; 257/685; 257/686; 257/723; 257/777

(58) Field of Classification Search ........... 257/784, 257/E23.085, 786, 528, 532, 690, 728, 725, 257/685, 686, 723, 777, 724, E25.029; 29/25.01
See application file for complete search history.

(56) References Cited

U.S. PATENT DOCUMENTS

| | | | |
|---|---|---|---|
| 6,342,724 B1 | 1/2002 | Wark et al. | |
| 6,768,190 B2 | 7/2004 | Yang et al. | |
| 7,005,325 B2 | 2/2006 | Chow et al. | |
| 7,196,416 B2 * | 3/2007 | Hochstenbach et al. | 257/712 |
| 7,233,065 B2 * | 6/2007 | Watanabe et al. | 257/723 |
| 7,622,811 B2 * | 11/2009 | Chow et al. | 257/784 |
| 2001/0000927 A1 * | 5/2001 | Rodenbeck et al. | 257/778 |
| 2004/0188854 A1 * | 9/2004 | Konishi et al. | 257/777 |
| 2004/0262766 A1 * | 12/2004 | Houle | 257/758 |
| 2007/0131737 A1 * | 6/2007 | Renavikar et al. | 228/231 |
| 2007/0138648 A1 * | 6/2007 | Vinn et al. | 257/777 |
| 2008/0258259 A1 | 10/2008 | Osaka et al. | |
| 2008/0299709 A1 | 12/2008 | Corisis et al. | |
| 2008/0305582 A1 | 12/2008 | Fillion et al. | |
| 2008/0315356 A1 | 12/2008 | Reisner | |

OTHER PUBLICATIONS

Sturcken et al., "Cover Story: Bare Chip Stacking", Advanced Packaging Magazine, Apr. 2003, 5 pages <http://ap.pennet.com/Articles/Article_Display.cfm?Section=Archives&Subsection=Display&ARTICLE_ID=172233>.

* cited by examiner

*Primary Examiner* — Alexander O Williams

(57) ABSTRACT

One or more electronic components can be mounted on the back side of a semiconductor die. The components can be passive components, active components, or combinations thereof. The components can be soldered to signal routes on the back side of the die, the signal routes being attached to the die using a metallization layer or using one or more dielectric layer sections. Placing components on the back side of the die can allow for incorporation of the components without necessarily increasing the form factor of the die's package.

10 Claims, 7 Drawing Sheets

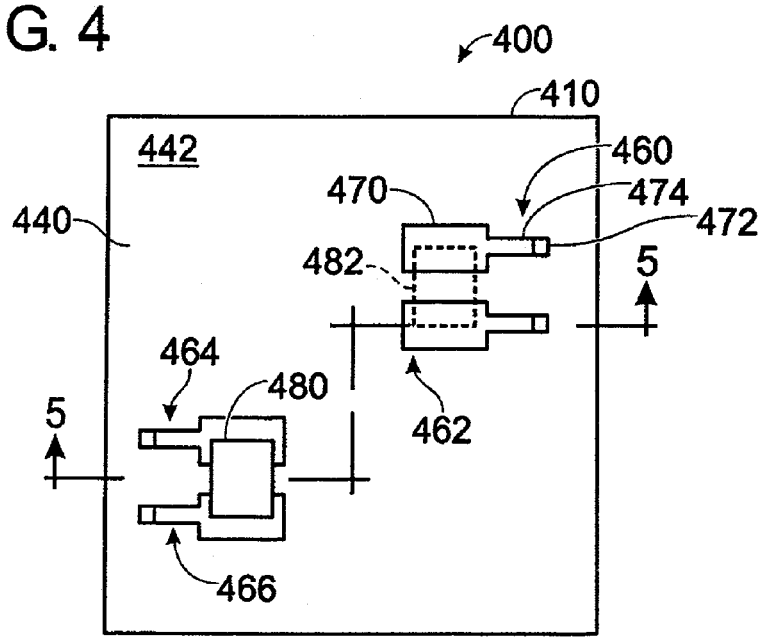
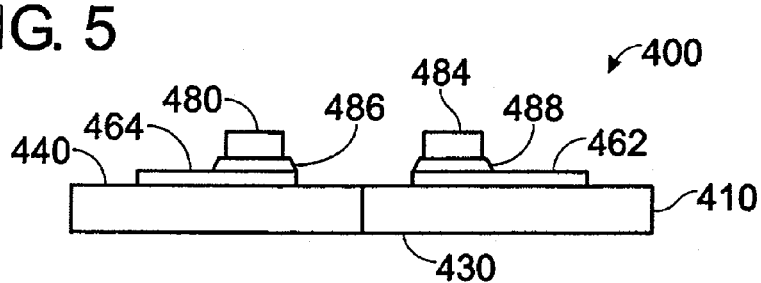
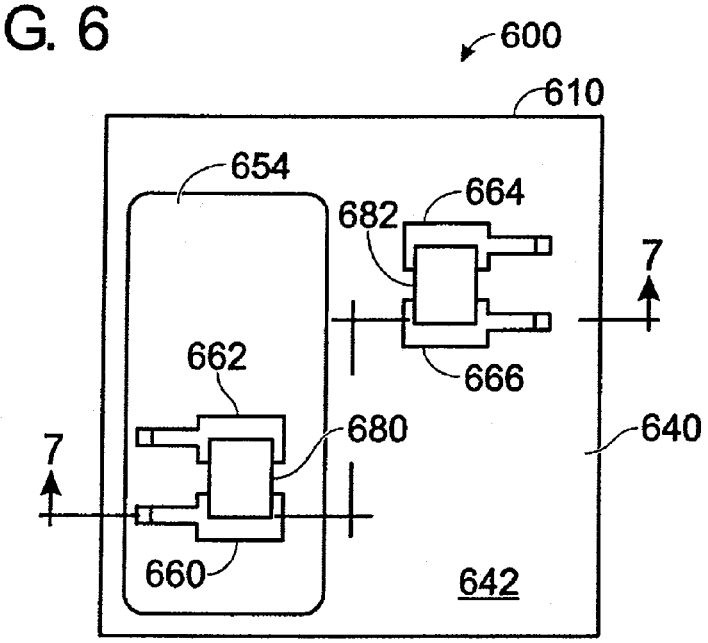

SEMICONDUCTOR ASSEMBLY WITH COMPONENT PADS ATTACHED ON DIE BACK SIDE

CROSS-REFERENCE TO RELATED APPLICATION(S)

This is a divisional of U.S. patent application Ser. No. 11/521,974, now U.S. Pat. No. 7,622,811, filed Sep. 14, 2006.

FIELD

The disclosure relates to semiconductor packaging.

BACKGROUND

Microchips are often packaged in various containers. It can be desirable to package a microchip with additional components, such as discrete components or other microchips. For example, U.S. Pat. No. 7,005,325 to Chow et al. states: "[P]assive components have been placed on the leadframe [of a semiconductor package] between the leads to eliminate negative electrical effects. These passive devices include capacitors, resistors, and inductors." See col. 1, lines 33-36. However, including these additional components in a package (e.g., along the periphery of the die) can increase the package form factor.

One approach to accommodating two or more microchips inside a single package is described in U.S. Pat. No. 6,768,190 to Yang et al., which discloses "a multi-chip module having a stack type flip-chip design for accommodating two or more chips each having a different function inside a single package, thereby reducing overall production cost." See col. 2, lines 7-10.

SUMMARY

A semiconductor assembly can be made up, at least in part, of a semiconductor die having an active side and a back side, with one or more electronic components mounted on the back side of the die. The components can be passive components, active components, or combinations thereof The components can be attached to the die using a metallization layer or one or more dielectric material sections. Placing components on the back side of the die can allow for incorporation of the components without necessarily increasing the form factor of the die's package.

In one embodiment, a semiconductor assembly comprises a semiconductor die having an active side and a back side, a dielectric material having a first side and a second side, with the first side of the dielectric material attached to the back side of the semiconductor die, a plurality of component pads attached to the second side of the dielectric material section, and one or more electronic components electrically coupled to one or more of the component pads. One or more of the electronic components can be a passive component. A plurality of signal traces can be electrically coupled with the plurality of component pads. A plurality of bond pads can be electrically coupled with the plurality of component pads. In some embodiments, the dielectric material section comprises a first section of dielectric material and a second section of dielectric material. In other embodiments at least one of the one or more electronic components has exactly two terminals. At least one of the electronic components can be in communication with a component pad via a solder connection, wherein the dielectric material provides a solder non-wettable area for the solder connection. In some embodiments the dielectric material section exposes a substantial portion of the back side of the semiconductor die. In other embodiments, the assembly further comprises a metallization layer having a first side and a second side, the first side being attached to the die back side, the metallization layer comprising a plurality of component pads. In yet other embodiments, the assembly is packaged in a flip chip package. The package can further comprise a die paddle and a packaging material, the packaging material at least partially encompassing the semiconductor die.

In a further embodiment, a semiconductor assembly comprises a semiconductor die having an active side and a back side, a metallization layer having a first side and a second side, the first side attached to the die back side and the metallization layer comprising a plurality of component pads, and one or more discrete electronic components electrically coupled with at least two of the plurality of component pads. In some embodiments, the one or more discrete electrical components are passive components. In an additional embodiment, the second side of the metallization layer is not in contact with a passivation layer. The assembly can further comprise a plurality of signal traces can be in electrical communication with the plurality of component pads. The assembly can further comprise a plurality of wirebond pads can be in electrical communication with the plurality of component pads. The metallization later can be a selective metallization coating with a mask or a selectively etched metallization coating. In one embodiment, at least one of the electronic components is attached to the component pads via a plurality of solder connects, wherein the die back side provides a solder non-wettable area for at least one of the solder connects.

In yet another embodiment, a method of packaging an integrated circuit comprises providing a semiconductor die having an active side and a back side, providing a dielectric material section having an active side and a back side, attaching the first side of the dielectric material section to the back side of the semiconductor die, forming a plurality of component pads on the second side of the dielectric material section, and electrically coupling one or more electronic components with at least two of the plurality of component pads. In some embodiments, at least one of the electronic components can be a passive component. The dielectric material layer can comprise a first section of dielectric material and a second section of dielectric material. Electrically coupling one or more electronic components with at least two of a plurality of component pads can comprise creating one or more solder connections between the electronic components and the component pads, wherein the dielectric material provides a solder non-wettable area for the solder connection. In further embodiments, at least part of the semiconductor die can be encapsulated with one or more packaging materials.

In another embodiment a method of making a semiconductor assembly comprises providing a semiconductor die having an active side and a back side, providing a metallization layer having a first side and a second side, the first side being attached to the die back side, wherein the metallization layer comprises a plurality of component pads, and further comprising electrically coupling one or more discrete electronic components with at least two of the plurality of component pads. In a further embodiment, at least one of the discrete electronic components is a passive component. In yet another embodiment, the second side of the metallization layer is not in contact with a passivation layer.

The foregoing and other objects, features, and advantages of the invention will become more apparent from the following detailed description, which proceeds with reference to the accompanying figures.

BRIEF DESCRIPTION OF THE DRAWINGS

FIG. 4 is a plan view of one embodiment of a semiconductor assembly with a component attached to the back side of a die.

FIG. 5 is a cross-sectional view of the semiconductor assembly of FIG. 4.

FIG. 6 is a plan view of one embodiment of a semiconductor assembly with components attached to the back side of a die.

DETAILED DESCRIPTION

As used in this application and in the claims, the singular forms "a," "an," and "the" include the plural forms unless the context clearly dictates otherwise. Additionally, the term "includes" means "comprises." Further, the term "coupled" means electrically or electromagnetically coupled or linked and does not exclude the presence of intermediate elements between the coupled items.

The system, apparatus, and method described herein are provided to exemplify the invention, and the scope of the invention, and the scope of the invention is not limited to such exemplary features. Instead, the present disclosure is directed toward all novel and non-obvious features and aspects of the various disclosed embodiments, alone and in various combinations and sub-combinations with one another. The disclosed embodiments are not limited to any specific aspect or feature or combinations thereof.

Although the operations of embodiments of the disclosed method are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed system, method, and apparatus can be used in conjunction with other systems, methods, and apparatus. Additionally, the description sometimes uses terms like "produce" and "provide" to describe the disclosed method. These terms are high-level abstractions of the actual operations that can be performed. The actual operations that correspond to these terms can vary depending on the particular implementation and are readily discernible by one of ordinary skill in the art.

Figure 1:
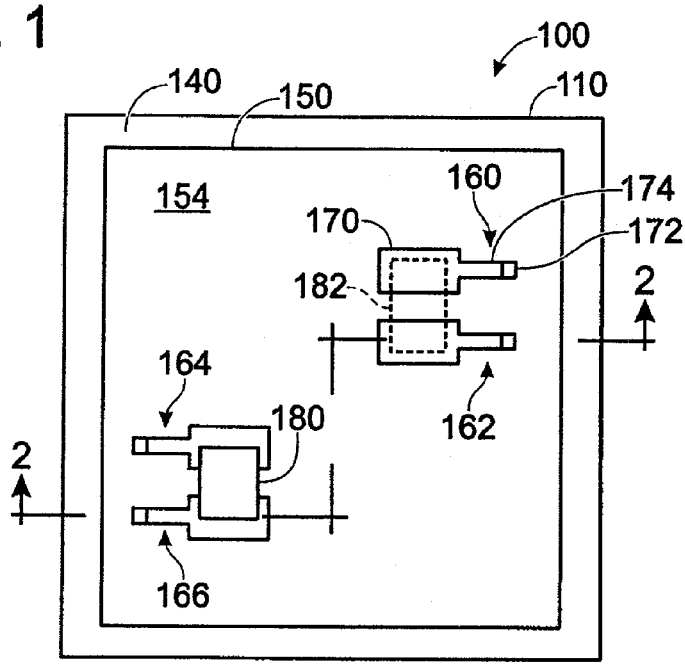
FIG. 1 is a plan view of one embodiment of a semiconductor assembly with a component attached to the back side of a die.
Figure 2:
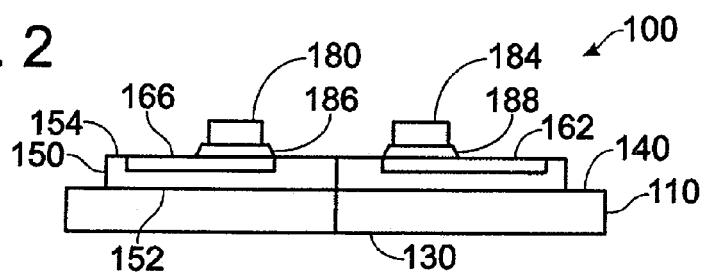
FIG. 2 is a cross-sectional view of the embodiment shown in FIG. 1.

FIG. 1 shows a plan view of one embodiment of a semiconductor assembly 100 comprising an integrated circuit die 110. The die 110 comprises an active side 130 (shown in FIG. 2) having circuit elements (not shown) and a back side 140, the back side 140 being substantially opposite to the active side 130. A section of dielectric material 150 (e.g., circuitry tape or a similar material) can comprise a first surface 152 (shown in FIG. 2) and a second surface 154. The first surface 152 of the dielectric material section 150 can be attached to the back side 140 by any suitable method. For example, in one embodiment the dielectric material section 150 can be attached by lamination, and in another embodiment, it can be attached by adhesive. Second surface 154 of the dielectric material section 150 includes one or more signal routes such as signal routes 160, 162, 164, 166. As used in this application and in the claims, "signal route" refers to a section of conductive material for conveying electric signals. The signal route 160 can comprise a component pad 170, a signal trace 174 and a bond pad 172. As used in this application and in the claims, "component pad" refers to a region of conductive material for mounting an electronic component, "signal trace" refers to a region of conductive material designed to carry an electric signal, and "bond pad" refers to a region of conductive material for forming a connection with a wire. In some embodiments, the bond pad 172 is positioned adjacent to edge of die 110 to facilitate wire bonding. The signal route 160 can comprise the component pad 170, the signal trace 174 and the bond pad 172 as separate components, or the signal route 160 can be a continuous piece of conductive material. The signal routes 162, 164, 166 can comprise components similar to the signal route 160, although the signal routes 160, 162, 164, 166 can vary with respect to size and shape. An electronic component 180 can be electrically coupled to one or more of the signal routes 160, 162, 164, 166 at, for example, the component pad, using one or more methods known in the art, such as surface-mount technology (SMT). For example, FIG. 2 illustrates two electronic components 180, 184 electrically coupled to the signal routes 166, 162, respectively, via the solder connections 186, 188, respectively. Returning to FIG. 1, region 182 exemplifies one position where an electronic component 180 might be configured for positioning relative to the component pads of the signal routes 160, 162. In one embodiment, one or more signal routes such as the signal route 160 can be configured to electrically couple two or more electrical components such as the component 180.

FIG. 2 shows a cross-sectional view of the assembly 100 taken along broken line 2-2 indicated in FIG. 1. The exemplary embodiment illustrated by FIG. 2 depicts the signal routes 160, 162 as being at least partially embedded in the dielectric material section 150. A person of ordinary skill in the art will appreciate that, in other embodiments, the signal routes 162, 166 can be fabricated on top of the second surface 154 of the dielectric material section 150. The material of dielectric material section 150 can be selected to provide a solder non-wettable area for the solder connections 186, 188, which can allow for improved solder handling during component mounting. Accordingly, a layer of solder resist on the dielectric material section 150 may be unnecessary. Alternatively, solder resist can be provided as a continuous layer or in selected locations.

Figure 3:
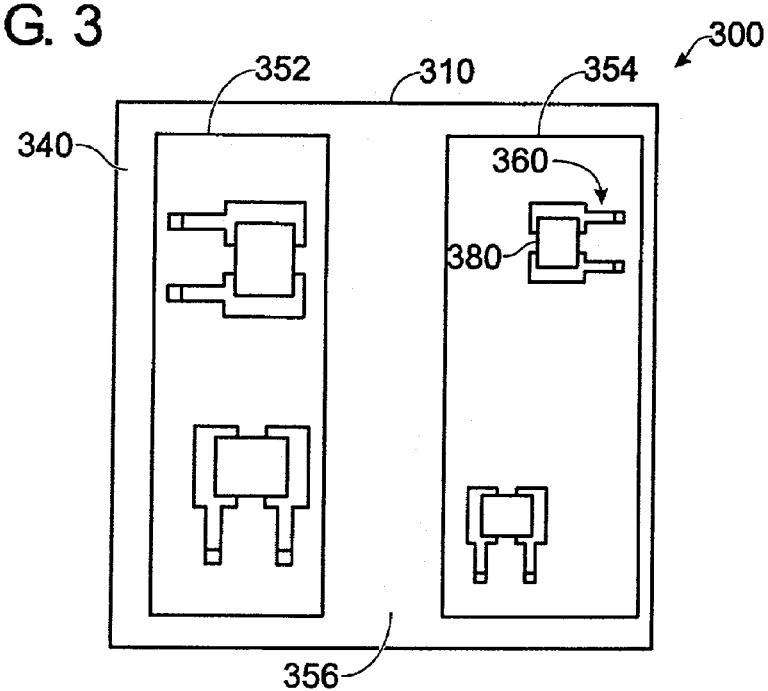
FIG. 3 is a plan view of one embodiment of a semiconductor assembly with a component attached to the back side of a die.

FIG. 3 shows a plan view of a semiconductor assembly 300. Back side 340 of die 310 is provided with dielectric material sections 352, 354. In other embodiments, more than two dielectric material sections can be used. The sections can be located as desired, including as required by package requirements, e.g.: component size and functionality, as well as location and availability of lead fingers for wire bonding for components (including die). Although the sections 352, 354 are depicted as being generally rectangular, the size and shape of the sections 352, 354 can be modified as desired. In some embodiments, dielectric material sections such as the dielectric material sections 150 or 352, 354 can be configured to occupy substantially all of a die back side (e.g., die back side 140 as shown in FIG. 1), or they can be configured to leave a substantial area of a die back side unoccupied (e.g., area 356 of FIG. 3).

In some embodiments, electronic components such as the component 180 can comprise passive components (e.g., resistors, capacitors, inductors), active components (e.g., transistors, diodes), one or more additional semiconductor die, or combinations thereof. The signal routes can be configured according to a number of terminals of a selected electronic component, e.g., two pads can be fabricated for a two-terminal component such as a resistor, or three pads for a transistor. In further embodiments, more signal routes are fabricated on the dielectric material section 150 than are actually used by electronic components. For example, a generic design of the dielectric material section 150 can be manufactured for use with several embodiments using varying numbers and combinations of electronic components, with some embodiments using more signal routes than other embodiments.

FIG. 4 shows a plan view of another representative embodiment of a semiconductor assembly 400 comprising an integrated circuit die 410 having an active side 430 (not shown in this view) and a back side 440. In this particular embodiment, the back side 440 features a metallization layer 442 comprising two or more signal routes 460, 462, 464, 466, which can be similar to the signal routes of other embodiments described above. For example, the signal route 460 can comprise a component pad 470, a signal trace 474 and a bond pad 472. The signal routes 462, 464, 466 can comprise components similar to the signal route 460, although the signal routes 460, 462, 464, 466 can vary in size and shape. The metallization layer 442 can be made of a suitable material, or combinations of suitable materials. In some embodiments, the metallization layer 442 is made of copper or one or more other metals. The metallization layer 442 can be formed by applying a metallization coating to the die back side 440, followed by selectively etching the back side. In another embodiment, a metallization coating can be selectively applied with a mask during a coating process. One or more electronic components 480 can be electrically coupled to one or more component pads, e.g., the component pad 470 on the signal route 460. The component can be coupled to the pad using one or more methods known in the art, such as surface-mount technology (SMT). In one embodiment, one or more signal routes 460, 462, 464, 466 can be configured to electrically connect two or more electrical components 480 to each other. Dotted line 482 exemplifies where an electronic component 484 (shown in FIG. 5) might be positioned relative to the signal routes 460, 462.

FIG. 5 shows a side cross-sectional view of assembly 400 taken along the broken line 5-5 indicated in FIG. 4. Relative to FIG. 4, FIG. 5 depicts an additional electronic component 484, as well as solder 486, 488 used to attach the components 480, 484 to their respective signal routes 464, 462. The surface area of die back side 440 that is not covered by the metallization layer 442 (e.g., not covered by signal routes 460) can act as a solder non-wettable area. Thus an additional solder resist layer on die back side 440 can be unnecessary. Alternatively, solder resist can be provided as a continuous layer or in selected locations. In one embodiment, no passivation layer is added to the die back side 440 (e.g., on top of the metallization layer 442), as the silicon of the die is non-conductive.

As was discussed with respect to similar assemblies 100, 300, the electronic components 480, 484 can comprise passive components (e.g., resistors, capacitors, inductors), active components (e.g., transistors, diodes), or combinations thereof. In other embodiments, the components 480, 484 comprise additional semiconductor die. The component pads can be configured according to a number of terminals of a selected electronic component, e.g., two pads can be fabricated for a two-terminal component such as a resistor, or three pads for a transistor. In some embodiments, more component pads are fabricated in the metallization layer than are actually used by electronic components electrically coupled to the metallization layer. For example, a generic arrangement and number of component pads can be manufactured in the metallization layer for use with multiple embodiments using varying numbers and combinations of electronic components, with some embodiments using more component pads than other embodiments.

Figure 7:
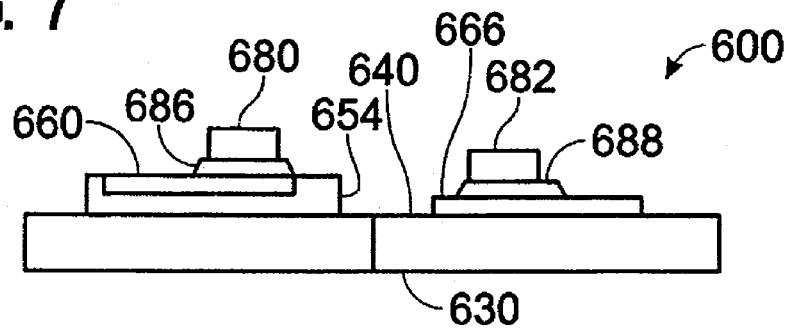
FIG. 7 is a cross-sectional view of the semiconductor assembly of FIG. 6.

FIG. 6 shows a plan view of one embodiment of an assembly 600 combining some features of assemblies 100, 300 and 400. For example, a semiconductor die 610 can comprise an active side 630 (shown in FIG. 7) and a back side 640 with a dielectric material section 654 occupying a portion of the backside 640. The dielectric material section 654 can have one or more signal routes 660, 662 to which an electronic component 680 can be attached. The back side of the same die also can feature one or more signal routes 664, 666 fabricated in a metallization layer 642. An electronic component 682 can be attached to the signal routes 664, 666. FIG. 7 shows a side cross-sectional view of the assembly 600, taken along the broken line 7-7 in FIG. 6. As shown in FIG. 7, the components 680, 682 can be coupled to the signal routes 660, 666 with respective solder connections 686, 688.

Figure 8:
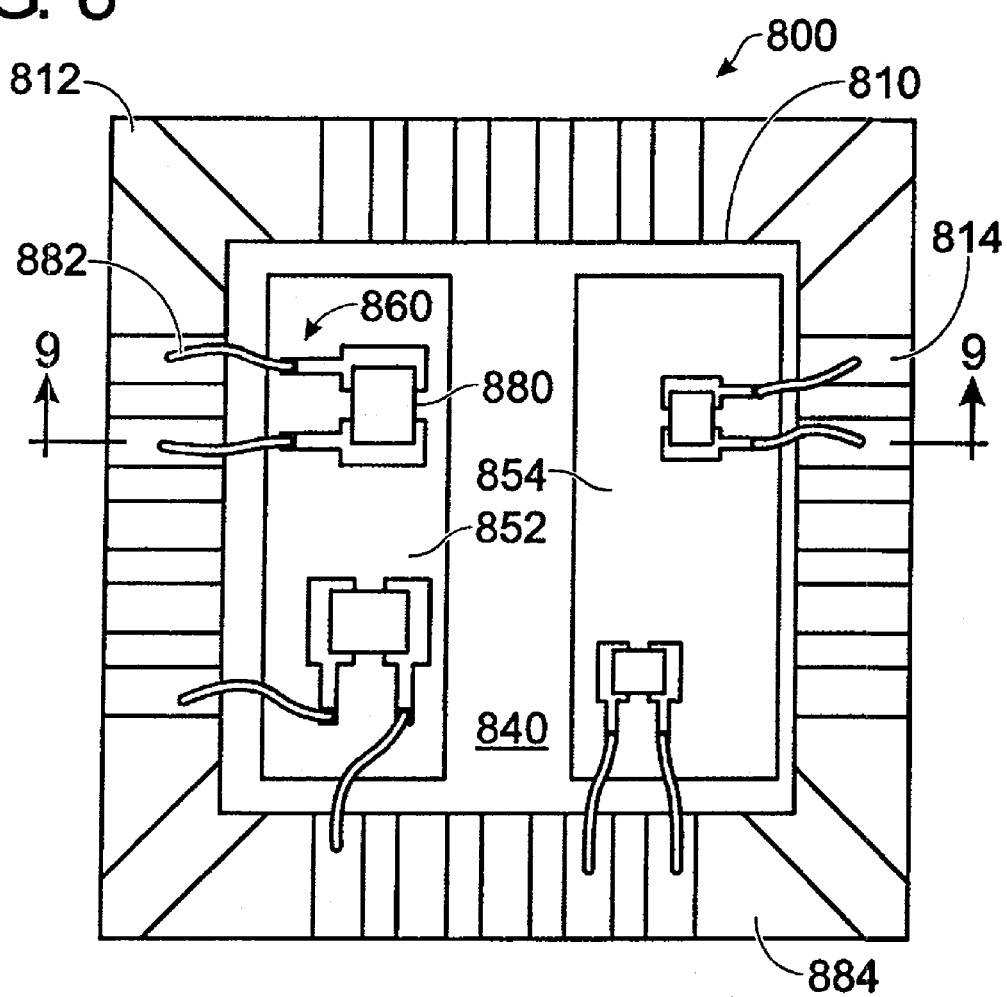
FIG. 8 is a plan view of one embodiment of a die in a flip chip package.

FIG. 8 shows a plan view of one embodiment of a die 810 in a flip chip package 800. Die 810 is depicted as being similar to the die 310 of assembly 300 of FIG. 3, with the dielectric material sections 852, 854 attached to the die back side 840. Additional die embodiments disclosed herein, and embodiments similar thereto also can be packaged in a similar manner. The flip chip package 800 comprises a die paddle 812 and a plurality of leads 814. One or more electronic components 880 can be electrically coupled to the leads 814 via one or more signal routes 860 and one or more wires 882.

Figure 9:
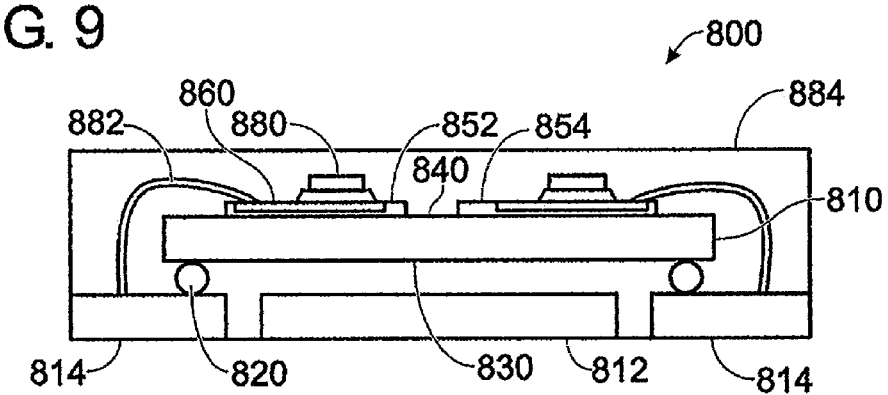
FIG. 9 is a cross-sectional view of the flip chip package of FIG. 8.

FIG. 9 shows a side cross-sectional view of the chip package 800, taken along the line 9-9 in FIG. 8. This view more clearly shows packaging material 884 which can encapsulate some or all of the die 810, the die paddle 812, the leads 814 and the electronic components 880. (Packaging material 884 also appears in FIG. 8 in spaces around the leads 814 and the die paddle 812, but the material positioned above the paddle 812 and the die 810 is not shown, to provide a clear view of those components.) A number of materials known in the art can be used for the packaging material 884. In some embodiments one packaging material 884 is used, and in other embodiments two or more materials 884 are used. The chip package 800 can further comprise bumps 820, which can provide an electrical coupling between the active side 830 of the die 810 and the one or more leads 814. The bumps 820 can be arranged in a variety of positions, as is known in the art, and can be coupled to one or more bonding pads (not shown) on the die active side 830. The leads 814, bumps 820, wires 882 and signal routes 860 can provide one or more electrical connections between the active side 830 and the electronic components 880.

Placing the electronic components 880 on the back side 840 of the die 810 can allow for incorporating such components into the chip package 800 without necessarily increasing the area of the package 800. In some embodiments, a first group of one or more electronic components 880 is placed on the back side 840, while a second group of the one or more electronic components 880 is placed approximately coplanar to the die 810 (e.g., on the leads 814).

In some embodiments, the chip package 800 can be incorporated into a chip-scale package (CSP), a ball-grid array (BGA) package, a direct chip array (DCA) package, a multichip module (MCM), package-on-package (PoP), package-in-package (PiP), or other packages known in the art.

Figure 10:
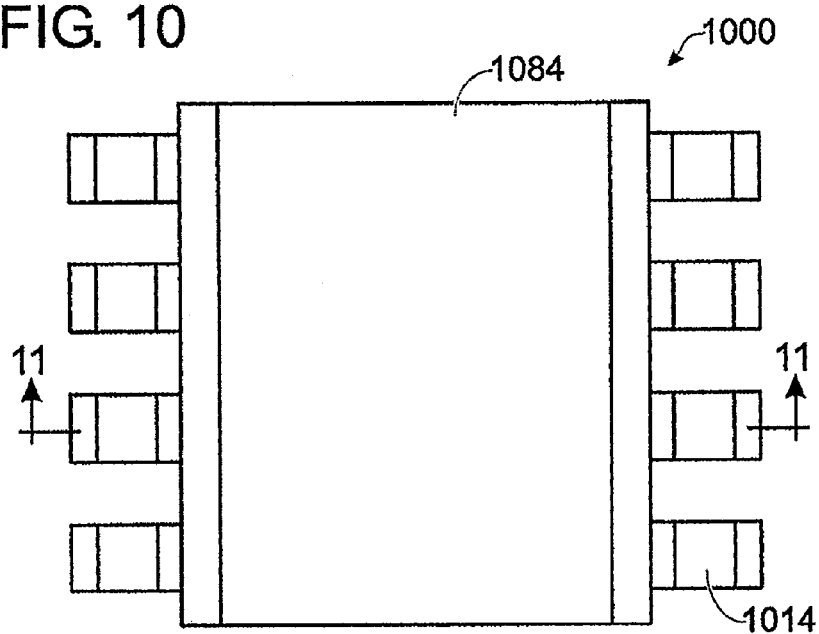
FIG. 10 is a plan view of one embodiment of a bond-on-lead package.
Figure 11:
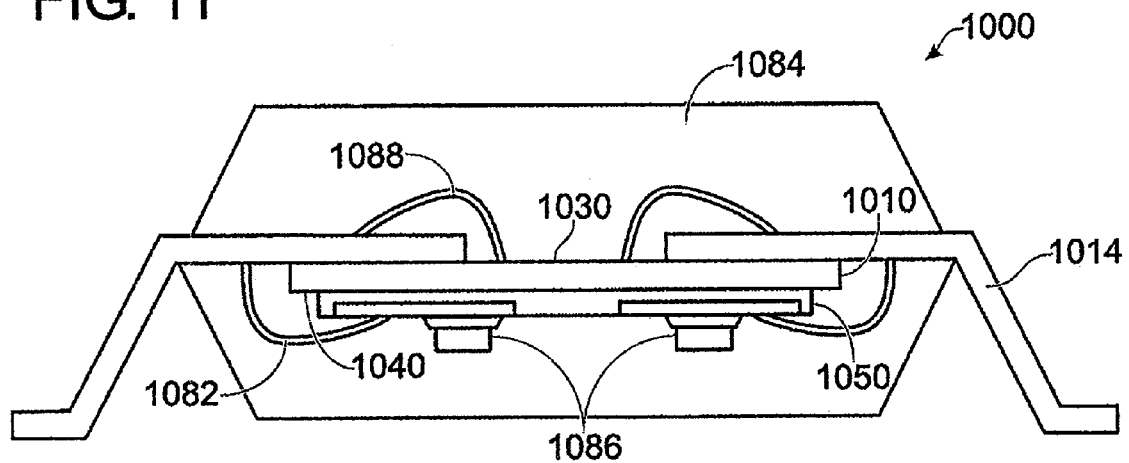
FIG. 11 is a cross-sectional view of the package of FIG. 10.

FIG. 10 depicts a plan view of one embodiment of a bond-on-lead (BOL) package 1000, the exterior of which comprises leads 1014 and at least one packaging material 1084. FIG. 11 shows a cross-sectional side view of the BOL package 1000, taken along the line 11-11 in FIG. 10. The depicted embodiment is a wirebond design, although in other embodiments a flip chip design can be used with a BOL package. In the depicted embodiment, the semiconductor die 1010 can be configured similarly to the die 110 of the assembly 100. (Other embodiments described above can also be used with a BOL package.) Dielectric material 1050, featuring one or more electronic components 1086, can be attached to the back side 1040 of the die 1010. Wires 1082 can electrically couple electronic components 1086 with one or more leads 1014. Wires 1088 can electrically couple the active side 1030 of the die 1010 with leads 1014. A configuration of the wires 1082, 1088 and the leads 1014 can electrically couple the components 1086 with the active side 1030.

Figure 12:
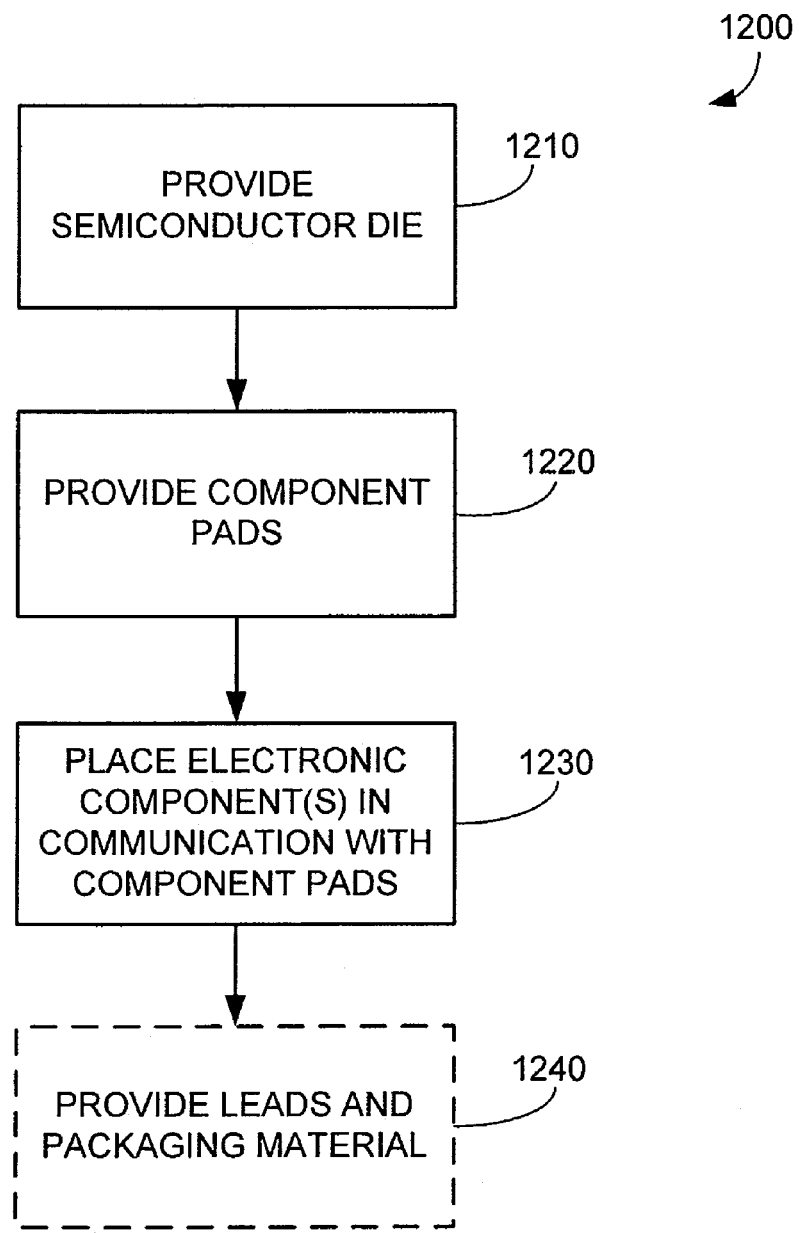
FIG. 12 is a flowchart for one embodiment of a method for making a semiconductor assembly.

FIG. 12 shows a flowchart for one embodiment of a method 1200 for making a semiconductor assembly. A semiconductor die can be provided (step 1210) and two or more component pads can be provided (step 1220). As is explained below, the component pads can be provided on a dielectric material section or in a metallization layer. One or more electronic components can be electrically coupled with two or more component pads (step 1230). In some embodiments, leads and packaging materials can be provided (step 1240), which can result in packages similar to packages 800 and 1000 as described above, for example.

Figure 13:
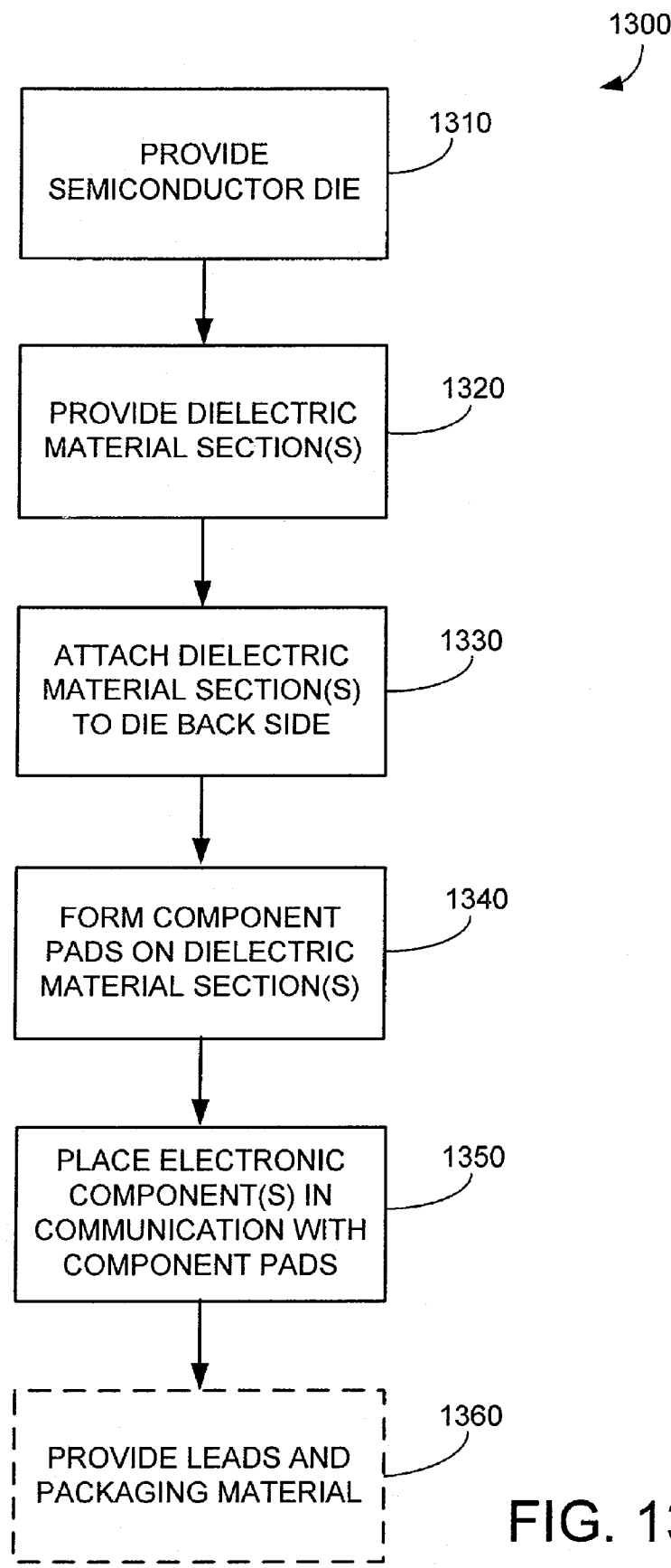
FIG. 13 is a flowchart for one embodiment of a method for making a semiconductor assembly.

FIG. 13 shows a flowchart for one embodiment of a method 1300 for making a semiconductor assembly similar to assemblies 100, 300, as described above. In step 1310, a semiconductor die can be provided. One or more dielectric material sections can be provided (step 1320) and attached to the back side of the die (step 1330). Component pads can be formed on the one or more dielectric material sections (step 1340), and one or more electronic components can be electrically coupled with the component pads (step 1350). In some embodiments, leads and packaging materials can be provided (step 1360), which can result in packages similar to packages 800 and 1000 as described above, for example.

Figure 14:
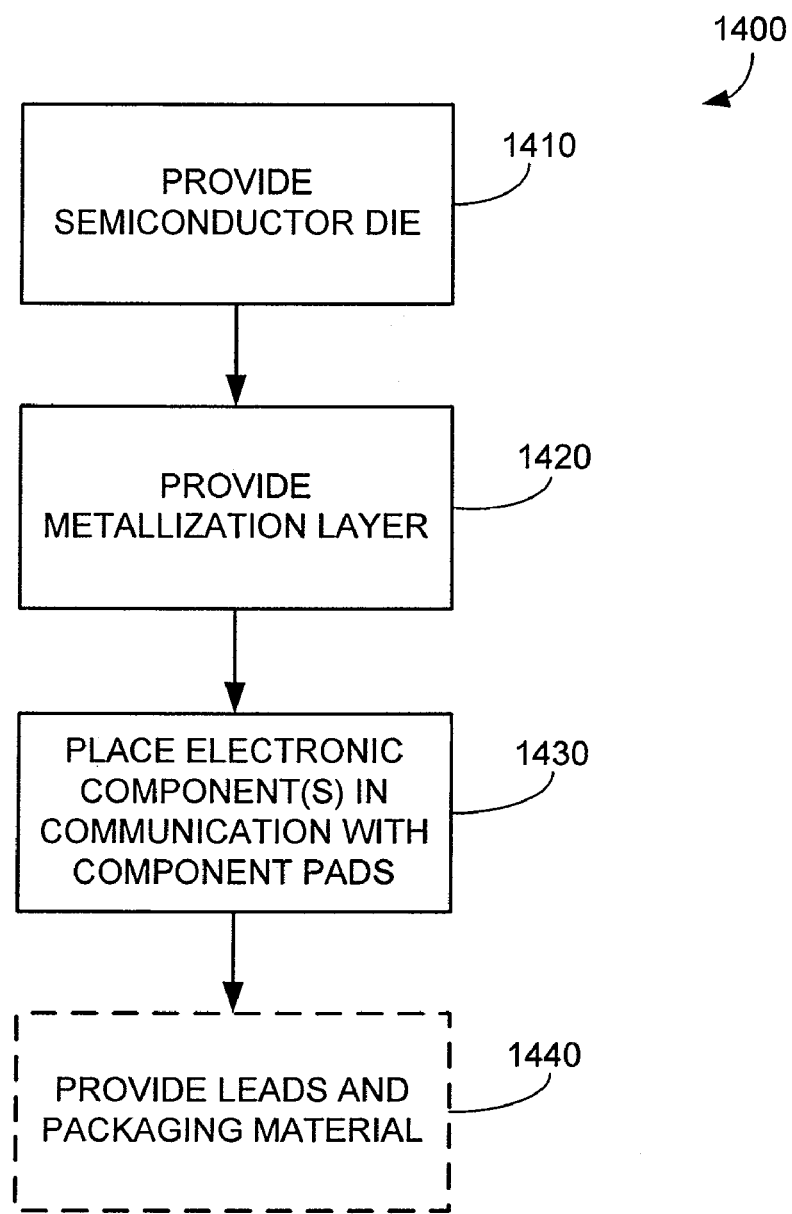
FIG. 14 is a flowchart for one embodiment of a method for making a semiconductor assembly.

FIG. 14 shows a flowchart for one embodiment of a method 1400 for making a semiconductor assembly similar to assembly 400, as described above. In step 1410, a semiconductor die can be provided. A metallization layer can be provided on the back side of the die using, for example, the methods described above with respect to assembly 400 (step 1420). The metallization layer can comprise a plurality of component pads, as well as signal traces and wirebond pads. Electronic components can be electrically coupled with at least some of the component pads (step 1430). In some embodiments, leads and packaging materials can be provided (step 1440), which can result in packages similar to packages 800 and 1000 as described above, for example.

Although the steps described above in methods 1200, 1300 and 1400 can be executed in the order described, some embodiments can carry out some steps in one or more different orders. For example, in method 1300, component pads can be formed on the one or more dielectric material sections (step 1340) before the sections are attached to the die back side (step 1330). Those of ordinary skill in the art will recognize other possible orders for the disclosed methods.

In view of the many possible embodiments to which the principles of the disclosed invention may be applied, it should be recognized that the illustrated embodiments are only preferred examples of the invention and should not be taken as limiting the scope of the invention. Rather, the scope of the invention is defined by the following claims. We therefore claim as our invention all that comes within the scope and spirit of these claims.

We claim:

1. A semiconductor assembly, comprising:
    a semiconductor die having an active side and a back side;
    a metallization layer having a first side and a second side, the first side being attached to the die back side, wherein the metallization layer comprises a plurality of component pads; and
    one or more discrete electronic components electrically coupled with at least two of the plurality of component pads.

2. The semiconductor assembly of claim 1, wherein the one or more discrete electrical components are passive components.

3. The semiconductor assembly of claim 1, wherein the second side of the metallization layer is not in contact with a passivation layer.

4. The semiconductor assembly of claim 1, further comprising a plurality of signal traces electrically coupled with the plurality of component pads.

5. The semiconductor assembly of claim 1, further comprising a plurality of bond pads electrically coupled with the plurality of component pads.

6. The semiconductor assembly of claim 1, wherein the metallization layer is a selective metallization coating with a mask or a selectively etched metallization coating.

7. The semiconductor assembly of claim 1, wherein at least one of the electronic components is attached to the component pads via a plurality of solder connects, and wherein the die back side provides a solder non-wettable area for at least one of the solder connects.

8. A method of making a semiconductor assembly, the method comprising:
    providing a semiconductor die having an active side and a back side;
    providing a metallization layer having a first side and a second side, the first side being attached to the die back side, wherein the metallization layer comprises a plurality of component pads; and
    electrically coupling one or more discrete electronic components with at least two of the plurality of component pads.

9. The method of claim 8, wherein at least one of the discrete electronic components is a passive component.

10. The method of claim 8, wherein the second side of the metallization layer is not in contact with a passivation layer.

* * * * *